US012297531B2

(12) United States Patent
Garrett et al.

(10) Patent No.: US 12,297,531 B2
(45) Date of Patent: May 13, 2025

(54) METHODS OF PREPARING MOLYBDENUM-CONTAINING FILMS

(71) Applicant: ENTEGRIS, INC., Billerica, MA (US)

(72) Inventors: Benjamin R. Garrett, Leander, TX (US); Michael Watson, Leander, TX (US); Pei Zhao, Leander, TX (US)

(73) Assignee: ENTEGRIS, INC., Billerica, MA (US)

( * ) Notice: Subject to any disclaimer, the term of this patent is extended or adjusted under 35 U.S.C. 154(b) by 172 days.

(21) Appl. No.: 17/982,220

(22) Filed: Nov. 7, 2022

(65) Prior Publication Data

US 2023/0142966 A1 May 11, 2023

Related U.S. Application Data

(60) Provisional application No. 63/277,829, filed on Nov. 10, 2021.

(51) Int. Cl.
*C23C 16/16* (2006.01)
*C23C 16/455* (2006.01)

(52) U.S. Cl.
CPC ........ *C23C 16/16* (2013.01); *C23C 16/45553* (2013.01)

(58) Field of Classification Search
CPC .... C23C 16/06; C23C 16/16; C23C 16/45553
See application file for complete search history.

(56) References Cited

U.S. PATENT DOCUMENTS

| 9,695,207 | B2 * | 7/2017 | Sato ........................ C07F 17/00 |
| 2011/0037065 | A1 * | 2/2011 | Ueno ................... H10K 85/361 438/46 |
| 2014/0370192 | A1 * | 12/2014 | Odedra ................... C23C 16/18 427/255.6 |
| 2015/0162534 | A1 * | 6/2015 | Maltenberger ....... H10K 85/361 252/519.21 |
| 2016/0002786 | A1 * | 1/2016 | Gatineau ........... H01L 21/02205 427/255.394 |
| 2019/0003050 | A1 * | 1/2019 | Dezelah .................. C23C 16/16 |
| 2020/0115798 | A1 | 4/2020 | Wright, Jr. |
| 2020/0131628 | A1 | 4/2020 | Baum |
| 2020/0199743 | A1 | 6/2020 | Wright, Jr. |
| 2020/0365456 | A1 * | 11/2020 | Thombare ......... H01L 21/76876 |
| 2021/0062331 | A1 | 3/2021 | Chen |

FOREIGN PATENT DOCUMENTS

| EP | 420589 | A * | 4/1991 | ........... H01L 21/285 |
| GB | 2204065 | A * | 11/1988 | ............. C23C 16/52 |
| KR | 20200056543 | A | 5/2020 | |
| WO | 2010114386 | A1 | 10/2010 | |
| WO | WO 2013112393 | A1 * | 8/2013 | ............. C07F 11/00 |
| WO | WO2017143246 | A1 * | 8/2017 | ............. C23C 16/16 |

OTHER PUBLICATIONS

Keskin, Seyma Goren, et al., "Synthesis, characterization and theoretical investigations of molybdenum carbonyl complexes with phosphorus/nitrogen/ phosphorus ligand as bidentate and tridentate modes". Polyhedron 138 (2017) 206-217.*
Garcia-Rodriguez, Raul, et al., "Molybdenum carbonyl complexes with pyridylimino acidato ligands". Dalton Transactions, 2006, 1218-1225.*
Li, Chen, et al., "Syntheses, structures and catalytic activities of molybdenum carbonyl complexes based on pyridine-imine ligands". Transition Metal Chemistry (2018) 43:193-199.*
Kaplan, L.H., et al., "The Deposition of Molybdenum and Tungsten Films from Vapor Decomposition of Carbonyls". J. Electrochem. Soc.: Solid State Science, May 1970, pp. 693-700.*
Cho, C.C., et al., "Molybdenum deposition from the decomposition of molybdenum hexacarbonyl". J. Appl. Phys. 65, 3035-3043 (1989).*
Cross, Jeffrey S., et al., "Low pressure chemical vapor deposition of molybdenum oxides from molybdenum hexacarbonyl and oxygen". Thin Solid Films, vol. 259, Issue 1, Apr. 1, 1995, pp. 5-13.*
Dezelah et al., Journal of Materials Chemistry, A low valent metalorganic precursor for the growth of tungsten nitride thin films by atomic layer deposition, vol. 17, pp. 1109-1116, 2007.
Dezelah et al., Journal of the American Chemical Society, Atomic Layer Deposition of Tungsten(III) Oxide Thin Films from W2(NMe2)6 and Water: Precursor-Based Control of Oxidation State in the Thin Film Material, pp. 9638-9639, 2006.
Carrasco et al., Terphenyl Complexes of Molybdenum and Tungsten with Quadruple Metal-Metal Bonds and Bridging Carboxylate Ligands, Journal of the American Chemical Society, ACS Publications, vol. 136, pp. 9173-9180, 2014.
Huang et al., Recent progress in atomic layer deposition of molybdenum disulfide: a mini review, Science China Materials, Springer, vol. 62, No. 7, pp. 913-924, 2019.
Olson, Laser Photodeposition of Molybdenum Oxide Thin Films from Organometallic Precursors, Dissertation, pp. 1-174, 1989.
Seghete et al., Molybdenum Atomic Layer Deposition Using MoF6 and Si2H6 as the Reactants, Chemistry of Materials, ACS Publications, vol. 23, pp. 1668-1678, 2011.

* cited by examiner

*Primary Examiner* — Bret P Chen

(57) ABSTRACT

A process for depositing a molybdenum-containing film onto a microelectronic device substrate, which comprises exposing the substrate, in a reaction zone, to a compound of Formula (I) under vapor deposition conditions, thereby forming a molybdenum-containing film on the substrate. The molybdenum-containing films include one or more of molybdenum metal, molybdenum oxide, molybdenum carbide, and molybdenum nitride.

13 Claims, 2 Drawing Sheets

METHODS OF PREPARING MOLYBDENUM-CONTAINING FILMS

PRIORITY CLAIM

The present invention claims priority to U.S. provisional patent application No. 63/277,829 with a filing date of Nov. 10, 2021. The priority document is incorporated by reference herein.

TECHNICAL FIELD

The present invention relates to certain molybdenum compounds useful as precursors in the vapor deposition of molybdenum-containing films onto microelectronic device substrates.

BACKGROUND

In consequence of their characteristics of extremely high melting point, low coefficient of thermal expansion, low resistivity, and high thermal conductivity, Group VI metals such as molybdenum, chromium, and tungsten are increasingly utilized in the manufacture of semiconductor devices, including use in diffusion barriers, electrodes, photomasks, power electronics substrates, low-resistivity gates, flat-panel displays, and interconnects.

Such utility has motivated efforts to achieve deposition of molybdenum, chromium, and tungsten films for such applications that is characterized by high conformality of the deposited film and high deposition rate to accommodate efficient high-volume manufacturing operations. This in turn has enabled efforts to develop improved molybdenum and tungsten source reagents useful in vapor deposition operations, as well as improved process parameters utilizing such reagents.

In atomic layer deposition (ALD) methodology, reactants and precursor molecules are introduced into a reaction zone in alternating pulses to create the desired chemical makeup of the layers. These precursors are delivered to the wafer in gaseous form. For precursors that are gases at standard temperature and pressure, the process is well-established. Precursor gases flow directly into the deposition chamber. Trends toward new interconnect materials requires a broader portfolio of precursors, many of which are liquids or solids at room temperature. These ALD precursors must have sufficient volatility, thermal stability, and reactivity with the substrates and the films being deposited. Whether they are liquid or solid, the vapor pressure of the precursor determines the process conditions.

Most liquid precursors are delivered at room temperature and vaporized by lowering the pressure. In general, liquids are easier to purify, handle, and deliver than solid precursors. Many integrated device manufacturers (IDMs), therefore, prefer liquid delivery systems.

Solids are more challenging because of the need to heat the material and the gas lines delivering it. Ideally, the precursors should be nonflammable, noncorrosive, nontoxic, simple to produce, and inexpensive.

SUMMARY

In summary, the invention provides certain molybdenum-containing compounds which are believed to be useful in the vapor deposition of molybdenum-containing films onto the surface of various microelectronic device substrates. In one aspect, the invention provides a process for depositing a molybdenum-containing film onto a microelectronic device substrate, which comprises exposing the substrate, in a reaction zone, to a compound of Formula (I):

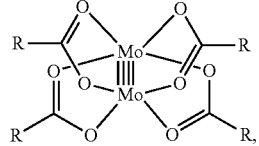

(I)

wherein each R is independently chosen from (i) $C_1$-$C_4$ alkyl or (ii) $C_1$-$C_4$ alkyl substituted by one or more halogen atoms;

under vapor deposition conditions, thereby forming a molybdenum-containing film on the substrate.

DETAILED DESCRIPTION

Figure 1:
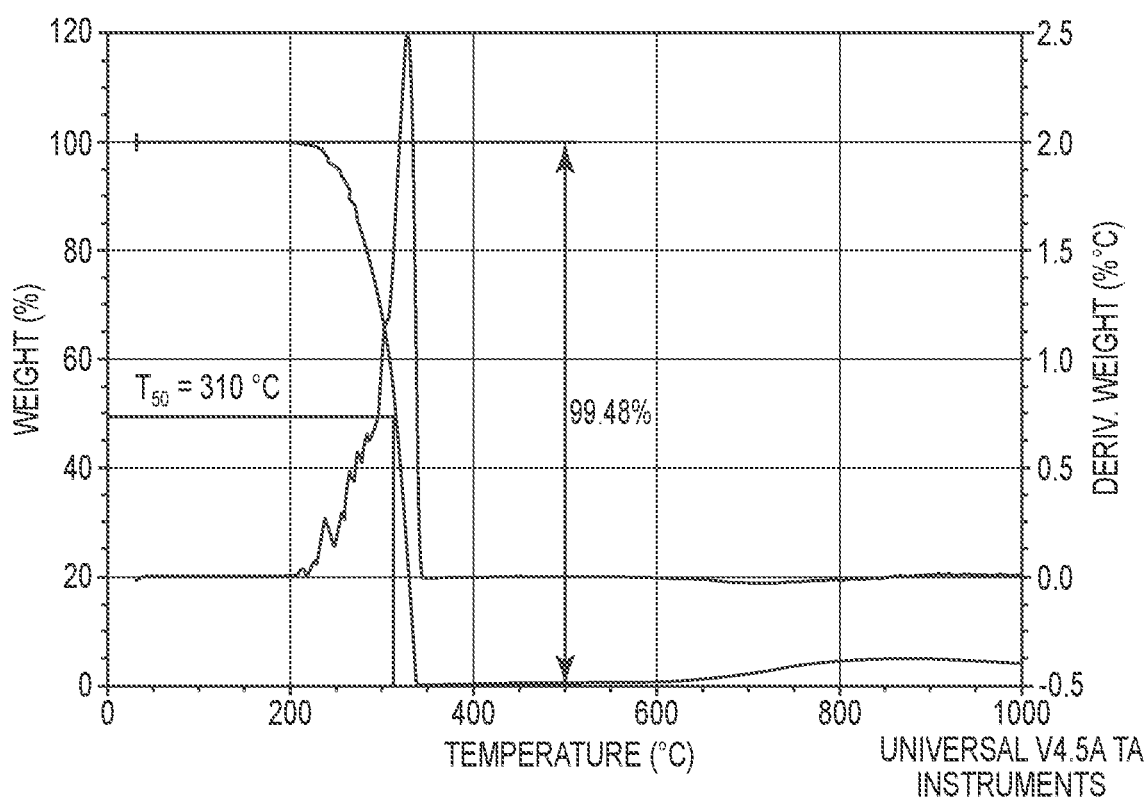
FIG. 1 is a thermogravimetric analysis of the compound molybdenum (II) acetate dimer showing that 50% of the mass is evaporated by 310° C.
Figure 2:
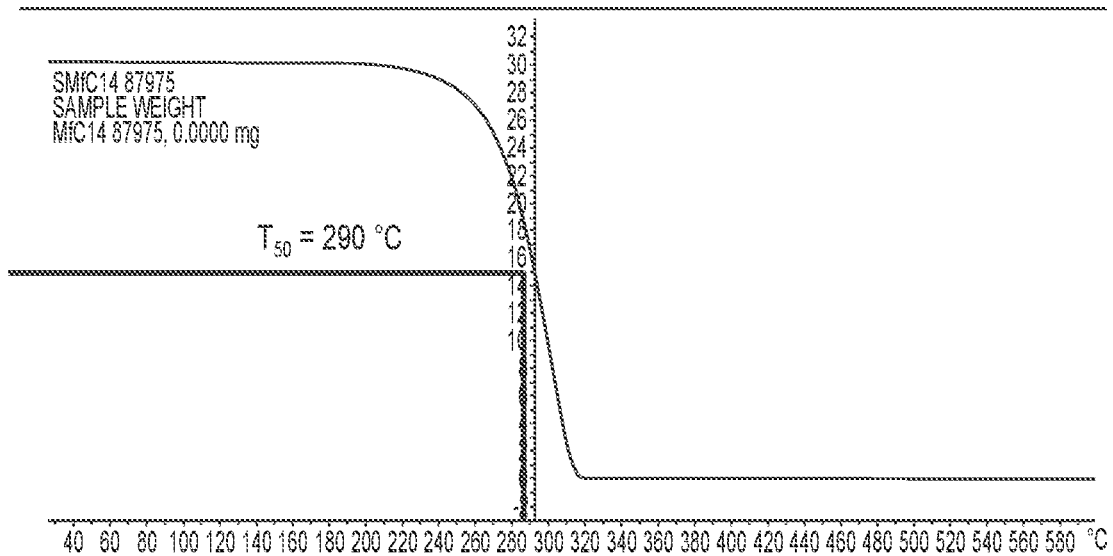
FIG. 2 is a thermogravimetric analysis for the common precursor $HfCl_4$ showing that 50% of the mass is evaporated by 290° C.; accordingly, molybdenum (II) acetate dimer can thus be delivered in vapor deposition techniques such as ALD at similar temperatures.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5).

In a first aspect, the invention provides a method for depositing a molybdenum-containing film onto a microelectronic device substrate, which comprises exposing the substrate, in a reaction zone, to a compound of Formula (I):

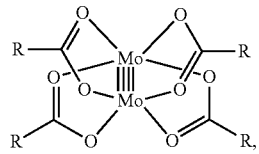

(I)

wherein each R is independently chosen from (i) $C_1$-$C_4$ alkyl or (ii) $C_1$-$C_4$ alkyl substituted by one or more halogen atoms;

under vapor deposition conditions, thereby forming a molybdenum-containing film on the substrate.

In one embodiment, each R is chosen from methyl, tert-butyl, and trifluoromethyl.

The compounds of Formula (I) as shown above exist as dimers of molybdenum-containing alkanoates. In other words, the compounds of Formula (I) have the empirical formula

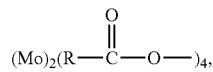

wherein R is as defined above.

Many of the compounds of Formula (I) are known and can be prepared by treating molybdenum hexacarbonyl (Mo(CO)$_6$) with acetic acid (i.e., when R is methyl). Similarly, other carboxylic acids can be utilized for corresponding R groups in Formula (I). (See, for example, *Rhenium and Molybdenum Compounds Containing Quadruple Bonds*, Alicia B. Brignole, F. A. Cotton, Z. Dori, Z. Dori, Z. Dori, G. Wilkinson; Book Editor(s):F. A. Cotton; First published: 1 Jan. 1972; https://doi.org/10.1002/9780470132449.ch15. Additionally, when R is methyl, the compound molybdenum (II) acetate dimer can be obtained commercially from Sigma Aldrich (CAS No. 14221-06-8).

The compounds of Formula (I) are believed to be useful in the chemical deposition of molybdenum-containing films. In this regard, the term "molybdenum-containing" films are those films comprised of one or more of molybdenum metal, molybdenum oxide, molybdenum carbide, and molybdenum nitride.

Chemical vapor deposition techniques include methods referred to as chemical vapor deposition (CVD), and atomic layer deposition (ALD) techniques, which also include a number of derivative versions of these such as UV laser photo-dissociation CVD, plasma assisted CVD, pulsed CVD, and plasma assisted ALD, among others. For depositing metals of high purity on two or three-dimensional microelectronic device substrates, these types of vapor deposition methods can be desirable because they can give high levels of purity of a deposited metal, often with good conformal step coverage on highly non-planar microelectronic device geometries.

In one embodiment, the molybdenum-containing film or layer deposited on the substrate surface may for example be formed by chemical vapor deposition, pulsed chemical vapor deposition (CVD) or atomic layer deposition (ALD), and thus directly with vapor derived from the compounds of Formula (I).

In one embodiment, the compound(s) of Formula (I) are introduced into the reaction zone containing the microelectronic device substrate, along with a reducing gas. The conditions in the reaction zone are chosen to cause the molybdenum contained within the precursor of Formula (I) to become deposited on the microelectronic device substrate as molybdenum metal. In one embodiment, the precursor and reducing gas are introduced into the reaction zone continuously. In another embodiment, an oxidizing gas such as oxygen, ozone, or a combination of water and hydrogen, can be introduced into the reaction zone in order to improve the composition of the deposited metal layer. The oxidizing gas is thus introduced in an amount and manner to cause the oxidizing gas to reduce the amount of carbon that becomes deposited in the completed molybdenum layer. In one embodiment, this oxidizing gas is introduced intermittently, in pulses. Further details on this technique can be found in U.S. Patent Publication No. 2020/0115798, incorporated herein by reference.

Accordingly, in one embodiment, the invention provides a process for depositing a molybdenum-containing film onto a microelectronic device substrate, comprising introducing a precursor of Formula (I) into a reaction zone containing the microelectronic device substrates while introducing a reducing gas into the reaction zone. In another embodiment, the process further comprises the step of intermittently introducing a pulse of an oxidizing gas into the reaction zone.

In another embodiment, the molybdenum precursors of Formula (I) can be introduced into a reaction zone containing a microelectronic device substrate, followed by a pulsed introduction of an oxidizing gas (e.g., H$_2$O vapor), followed by pulsed introduction of a reducing gas (e.g., H$_2$). In this fashion, a molybdenum metal film can be deposited onto the surface of a microelectronic device substrate. Accordingly, in a further embodiment, the invention provides a process for depositing a molybdenum-containing film onto a microelectronic device substrate, comprising (i) introducing a precursor of Formula (I) into a reaction zone containing the microelectronic device substrate, while intermittently (ii) exposing the substrate to an oxidizing gas; and intermittently (iii) exposing the substrate to a reducing gas. In certain embodiments, the precursor, oxidizing gas, and reducing gas are introduced in pulses in an atomic layer deposition regime.

In certain embodiments of the present invention, the oxidizing gas is comprised of gases chosen from H$_2$O vapor, H$_2$O$_2$, O$_3$, and N$_2$O. In certain embodiments of the present invention, the reducing gas is comprised of gases chosen from H$_2$, hydrazine (N$_2$H$_4$), methyl hydrazine, t-butyl hydrazine, 1,1-dimethylhydrazine, 1,2-dimethylhydrazine, and NH$_3$. It will be appreciated that given the oxidative potentials of H$_2$O$_2$ and O3, such gasses should not be utilized in conjunction with hydrazine (N$_2$H$_4$), methyl hydrazine, t-butyl hydrazine, 1,1-dimethylhydrazine, or 1,2-dimethylhydrazine, or if utilized sequentially, any such gases remaining from such a step should be purged from the reactor before exposure of the substrate to the other reactant. Further details on these techniques can be found in U.S. Patent Publication No. 2021/062331, incorporated herein by reference.

In certain cases, nitrogen-containing reducing gases such as ammonia (NH$_3$), hydrazine (N$_2$H$_4$); C$_1$-C$_4$ alkyl hydrazines, such as methyl hydrazine, t-butyl hydrazine, 1,1-dimethylhydrazine, and 1,2-dimethylhydrazine can be useful, but under some conditions will lead to molybdenum-containing nitride films instead of pure metal films. Likewise, in certain embodiments, carbon-containing reducing gases such as carbon monoxide, alkanes, alkenes, and alkynes can be useful, but under some conditions will lead to molybdenum carbide films instead of pure metal films. In one embodiment, the reducing gas is hydrogen.

The process disclosed herein may involve one or more purge gases as optional steps between the introduction of the metal precursor and the reducing gas and/or oxidizing gas, as well as carrier gas. The purge or carrier gas, which is used to either purge away unconsumed reactants and/or reaction by-products, or serve as a diluent and carrier for the metal precursor and reducing gas or oxidizing gas, is an inert gas that does not react with the precursors. Exemplary gases include, but are not limited to, argon, nitrogen, helium, neon, and mixtures thereof. In certain embodiments, a purge gas such as Ar is supplied into the reactor at a flow rate ranging from about 10 to about 10000 sccm for about 0.1 to 1000 seconds, thereby purging the unreacted material and any by-product that may remain in the reactor. Otherwise, such inert gases may be utilized as carrier gases to vary the concentration of the molybdenum precursor and/or oxidizing and/or reducing gas injected into the reaction zone as used herein. The utilization of a carrier gas and its flow rate will ultimately depend on the configuration of the deposition tool, its scale of operation, and the particular precursor utilized.

In one embodiment, a reducing gas can be utilized in conjunction with the precursors of Formula (I) to effect formation of an elemental molybdenum-containing film. Alternately, an oxidizing gas (i.e., co-reactant) such as oxygen may be added to the process when using the precursors as described herein as a means of depositing a metal oxide thin film, such as $MoO_2$.

In various embodiments, the vapor deposition conditions comprise an inert atmosphere, save for the optional presence of such reducing and/or oxidizing gases. In certain embodiments, the precursor vapor may be deposited in the substantial absence of other metal vapors.

In certain embodiments, the molybdenum-containing layer deposited on the substrate surface may for example be formed by chemical vapor deposition (CVD), pulsed chemical vapor deposition, atomic layer deposition (ALD), or other (thermal) vapor deposition technique, without the prior formation of a nucleation layer. The respective precursor vapor contacting steps may be carried out alternatingly and repetitively for as many cycles as are desired to form the desired thickness of the molybdenum-containing film. In various embodiments, the contact of the substrate (e.g., titanium nitride) layer with the compounds of Formula (I) vapor is conducted at temperature in a range of from 200° C. to 750° C. for such vapor deposition and at a pressure of about 0.5 to about 500 Torr. The pulsed introduction of the compound(s) of Formula (I), reducing gases, and oxidizing gases can in certain embodiments range in duration of from about 0.2 seconds to about 60 seconds.

The molybdenum metal-containing material can be deposited directly onto the substrate, to form a bulk deposit of molybdenum metal, oxide, carbide, or nitride, as noted above. If the deposition of elemental molybdenum films is desired and $H_2$ is utilized as reducing gas, the concentration of $H_2$ is critical towards the formation of molybdenum metal vs. oxide, as greater than four molar equivalents or an excess of $H_2$ is required for metal formation. Less than four (4) molar equivalents of $H_2$ will result in the formation of varying amounts of an oxide of the molybdenum metal, and thus will require further exposure to $H_2$ in order to reduce the molybdenum oxide thus formed.

The process chemistry for depositing such molybdenum-containing materials in accordance with the present disclosure may include deposition of elemental molybdenum, Mo(0), by the reaction $Mo_2(O_2CCH_3)_4 + 2H_2 \rightarrow 2Mo + 4HOCCH_3$. Intermediary reactions may be present and are well known in the art.

The molybdenum-containing material deposited in accordance with the method of the present invention may be characterized by any appropriate evaluation metrics and parameters, such as deposition rate of the molybdenum-containing material, film resistivity of the deposited molybdenum-containing material, film morphology of the deposited molybdenum-containing material, film stress of the deposited molybdenum-containing material, step coverage of the material, film composition and purity, and the process window or process envelope of appropriate process conditions. Any appropriate evaluation metrics and parameters may be employed, to characterize the deposited material and correlate same to specific process conditions, to enable mass production of corresponding semiconductor products and flat panel displays. Advantageously, the process of the invention is believed to be capable of depositing a film of high purity molybdenum metal onto a microelectronic device substrate.

The substrate utilized in the deposition process of the invention may be of any suitable type, and may for example comprise a microelectronic device substrate, e.g., a silicon substrate, a silicon dioxide substrate, or other silicon-based substrate. In various embodiments, the substrate may comprise one or more metallic or dielectric substrates, for example, Co, Cu, Al, W, WN, WC, TiN, Mo, MoC, $SiO_2$, W, SiN, WCN, $Al_2O_3$, AlN, $ZrO_2$, $HfO_2$, $SiO_2$, lanthanum oxide ($La_2O_3$), tantalum nitride (TaN), niobium nitride, ruthenium oxide ($RuO_2$), iridium oxide ($IrO_2$), niobium oxide ($Nb_2O_3$), and yttrium oxide ($Y_2O_3$).

In certain embodiments, for example in the case of an oxide substrate such as silicon dioxide, or alternatively a silicon or polysilicon substrate, the substrate may be processed or fabricated to include a barrier layer thereon, e.g., titanium nitride, for subsequently deposited material.

It will be appreciated that the method of the present invention may be carried out in numerous alternative ways, and under a wide variety of process conditions. The microelectronic or semiconductor device may be of any suitable type, and may for example comprise a DRAM device, 3-D NAND device, or other device or device integrated structure. In various embodiments, the substrate may comprise a via in which the molybdenum-containing material is deposited. The device may, for example, have an aspect ratio of depth to lateral dimension that is in a range of from 10:1 to 40:1. In other embodiments, the method may be carried out in the manufacture of a microelectronic device product, such as a mobile device, a logic device, a flat-panel display, or an IC packaging component.

In the process of the invention, the precursor compounds may be reacted with the desired microelectronic device surface or substrate in any suitable manner, for example, in a single wafer chamber, a multi-wafer chamber, or in a furnace containing multiple wafers.

As used herein, the term "microelectronic device" corresponds to semiconductor substrates, including 3D NAND structures, logic devices, DRAM, power devices, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a n-type channel metal oxide semiconductor (nMOS) and/or a p-type channel metal oxide semiconductor (pMOS) transistor and will eventually become a microelectronic device or microelectronic assembly. In addition, the underlying substrate need not be silicon, but could be insulators such as glass or sapphire, high bandgap semiconductors such as SiC or GaN, or other materials useful in the manufacture of electrical circuits. Such microelectronic devices contain at least one substrate, which can be chosen from, for example, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, porous inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

Aspects

In a first aspect, the invention provides a process for depositing a molybdenum-containing film onto a microelectronic device substrate, which comprises exposing the substrate, in a reaction zone, to a compound of Formula (I):

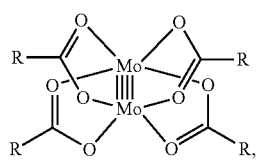
(I)

wherein each R is independently chosen from (i) $C_1$-$C_4$ alkyl or (ii) $C_1$-$C_4$ alkyl substituted by one or more halogen atoms;
under vapor deposition conditions, thereby forming a molybdenum-containing film on the substrate.

In a second aspect, the invention provides the process of the first aspect, wherein each R is $C_1$-$C_4$ alkyl.

In a third aspect, the invention provides the process of the first aspect, wherein each R is methyl.

In a fourth aspect, the invention provides the process of the first or second aspect, wherein each R is tert-butyl.

In a fifth aspect, the invention provides the process of the first aspect, wherein each R is trifluoromethyl.

In a sixth aspect, the invention provides the process of any one of the first through fifth aspects, wherein the vapor deposition conditions comprise a temperature of about 200° C. to about 750° C. and a pressure of about 0.5 to about 500 Torr.

In a seventh aspect, the invention provides the process of any one of the first through the sixth aspects, wherein the vapor deposition conditions comprise introducing a compound of Formula (I) into a reaction zone containing the microelectronic device substrates while introducing a reducing gas into the reaction zone.

In an eighth aspect, the invention provides the process of the seventh aspect, wherein the vapor deposition conditions further comprise the step of intermittently introducing a pulse of an oxidizing gas into the reaction zone.

In a ninth aspect, the invention provides the process of any one of the first through sixth aspects, wherein the vapor deposition conditions comprise (i) introducing a precursor of Formula (I) into a reaction zone containing the microelectronic device substrate, while intermittently (ii) exposing the substrate to an oxidizing gas; and intermittently (iii) exposing the substrate to a reducing gas.

In a tenth aspect, the invention provides the process of the seventh or ninth aspect, wherein the reducing gas is comprised of gases chosen from $H_2$, hydrazine, methyl hydrazine, t-butyl hydrazine, 1,2-dimethyl hydrazine, 1,2-dimethyl hydrazine, and $NH_3$.

In an eleventh aspect, the invention provides the process of the eighth or ninth aspect, wherein the oxidizing gas is chosen from $H_2O$ vapor, $H_2O_2$, $O_3$, and $N_2O$.

In a twelfth aspect, the invention provides the process any one of the first through the eleventh aspects, wherein the substrate is chosen from titanium nitride, tantalum nitride, aluminum nitride, aluminum oxide, zirconium oxide, hafnium oxide, silicon dioxide, silicon nitride, lanthanum oxide, ruthenium oxide, iridium oxide, niobium oxide, and yttrium oxide.

In a thirteenth aspect, the invention provides the process of any one of the first through the twelfth aspects, wherein the molybdenum-containing film is molybdenum metal.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:

1. A process for depositing a molybdenum-containing film onto a microelectronic device substrate, which comprises exposing the substrate, in a reaction zone, to a compound of Formula (I):

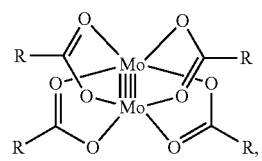
(I)

wherein each R is independently chosen from (i) $C_1$-$C_4$ alkyl or (ii) $C_1$-$C_4$ alkyl substituted by one or more halogen atoms;

under vapor deposition conditions, thereby forming a molybdenum-containing film on the substrate.

2. The process of claim 1, wherein each R is $C_1$-$C_4$ alkyl.

3. The process of claim 1, wherein each R is methyl.

4. The process of claim 1, wherein each R is tert-butyl.

5. The process of claim 1, wherein each R is trifluoromethyl.

6. The process of claim 1, wherein the vapor deposition conditions comprise a temperature of about 200° C. to about 750° C. and a pressure of about 0.5 to about 500 Torr.

7. The process of claim 1, wherein the vapor deposition conditions comprise introducing a compound of Formula (I) into a reaction zone containing the microelectronic device substrates while introducing a reducing gas into the reaction zone.

8. The process of claim 7, wherein the vapor deposition conditions further comprise the step of intermittently introducing a pulse of an oxidizing gas into the reaction zone.

9. The process of claim 8, wherein the oxidizing gas is chosen from $H_2O$ vapor, $H_2O_2$, $O_3$, and $N_2O$.

10. The process of claim 7, wherein the reducing gas is comprised of gases chosen from $H_2$, hydrazine, methyl hydrazine, t-butyl hydrazine, 1,2-dimethyl hydrazine, 1,2-dimethyl hydrazine, and $NH_3$.

11. The process of claim 1, wherein the vapor deposition conditions comprise (i) introducing a precursor of Formula (I) into a reaction zone containing the microelectronic device substrate, while intermittently (ii) exposing the substrate to an oxidizing gas; and intermittently (iii) exposing the substrate to a reducing gas.

12. The process of claim 1, wherein the substrate is chosen from titanium nitride, tantalum nitride, aluminum nitride, aluminum oxide, zirconium oxide, hafnium oxide, silicon dioxide, silicon nitride, lanthanum oxide, ruthenium oxide, iridium oxide, niobium oxide, and yttrium oxide.

13. The process of claim 1, wherein the molybdenum-containing film is molybdenum metal.

\* \* \* \* \*